United States Patent
Lam (12)

(10) Patent No.: US 6,388,335 B1
(45) Date of Patent: May 14, 2002

(54) INTEGRATED CIRCUIT PACKAGE FORMED AT A WAFER LEVEL

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/460,902

(22) Filed: Dec. 14, 1999

(51) Int. Cl.[7] .............................................. H01L 23/48
(52) U.S. Cl. ........................ 257/778; 257/738; 257/780
(58) Field of Search ................................ 257/778, 737, 257/738, 730

(56) References Cited

U.S. PATENT DOCUMENTS

| | | | | |
|---|---|---|---|---|
| 5,407,864 A | * | 4/1995 | Kim ........................... 437/203 |
| 5,422,516 A | * | 6/1995 | Hosokawa et al. .......... 257/775 |
| 5,468,681 A | * | 11/1995 | Pasch ......................... 437/183 |
| 5,495,667 A | * | 3/1996 | Farnworth et al. ............. 29/843 |
| 5,569,963 A | | 10/1996 | Rostoker et al. ............. 257/773 |
| 5,604,160 A | | 2/1997 | Warfield ..................... 437/209 |
| 5,734,201 A | * | 3/1998 | Djennas et al. ............. 257/783 |
| 5,790,384 A | * | 8/1998 | Ahmad et al. ............... 361/760 |
| 5,798,557 A | | 8/1998 | Salatino et al. ............. 257/416 |
| 5,821,624 A | | 10/1998 | Pasch ......................... 257/776 |
| 5,847,456 A | * | 12/1998 | Shoji .......................... 257/778 |
| 5,851,845 A | | 12/1998 | Wood et al. ................... 438/15 |
| 5,886,409 A | * | 3/1999 | Ishino et al. ................ 257/737 |
| 5,972,734 A | * | 10/1999 | Carichner et al. ........... 438/106 |
| 6,004,867 A | | 12/1999 | Kim et al. ................... 438/459 |
| 6,037,665 A | * | 3/2000 | Miyaaki ...................... 257/773 |
| 6,081,026 A | * | 6/2000 | Wang et al. ................. 257/700 |
| 6,081,429 A | * | 6/2000 | Barret ........................ 361/767 |
| 6,097,098 A | * | 8/2000 | Ball ............................ 257/786 |

* cited by examiner

*Primary Examiner*—Jerome Jackson, Jr.
*Assistant Examiner*—Lourdes Cruz
(74) *Attorney, Agent, or Firm*—Thomas Schneck; John P. McGuire, Jr.

(57) ABSTRACT

An integrated circuit package that is formed at the wafer level. The integrated circuit package occupies a minimum amount of space on an end-use printed circuit board. A pre-fabricated interposer substrate, made of metal circuitry and a dielectric base, has a plurality of metallized openings which are aligned with metallized wirebond pads on the top surface of a silicon wafer. Solder, or conductive adhesive, is deposited through the metallized openings to form the electrical connection between the circuitry on the interposer layer and the circuitry on the wafer. Solder balls are then placed on the metal pad openings on the interposer substrate and are reflowed to form a wafer-level BGA structure. The wafer-level BGA structure is then cut into individual BGA chip packages.

8 Claims, 3 Drawing Sheets

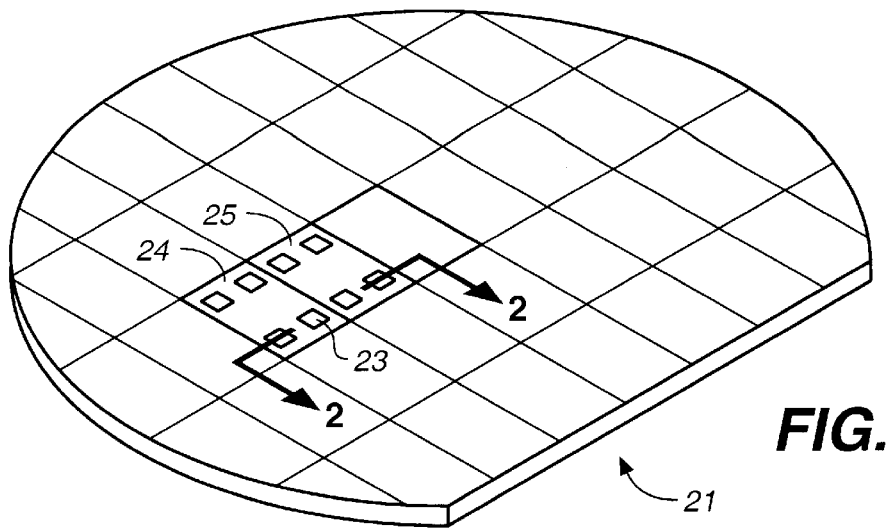
FIG._1
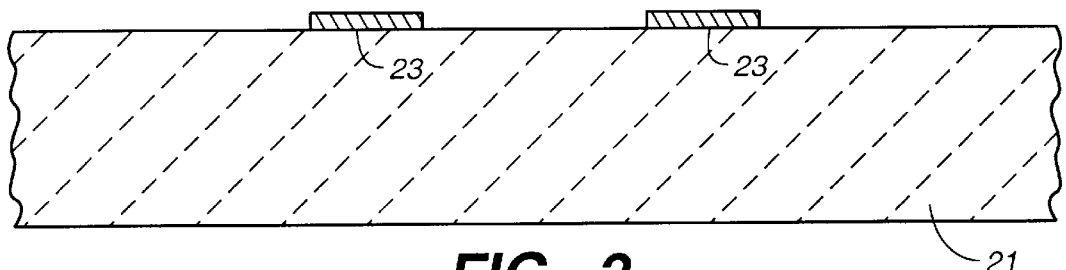
FIG._2
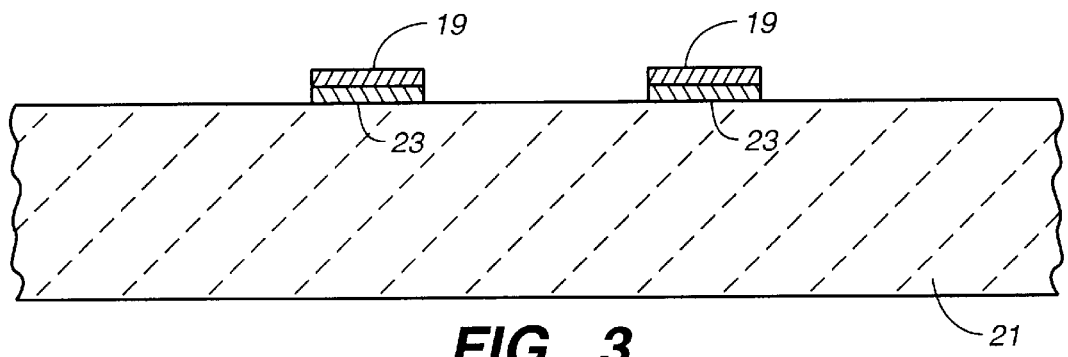
FIG._3
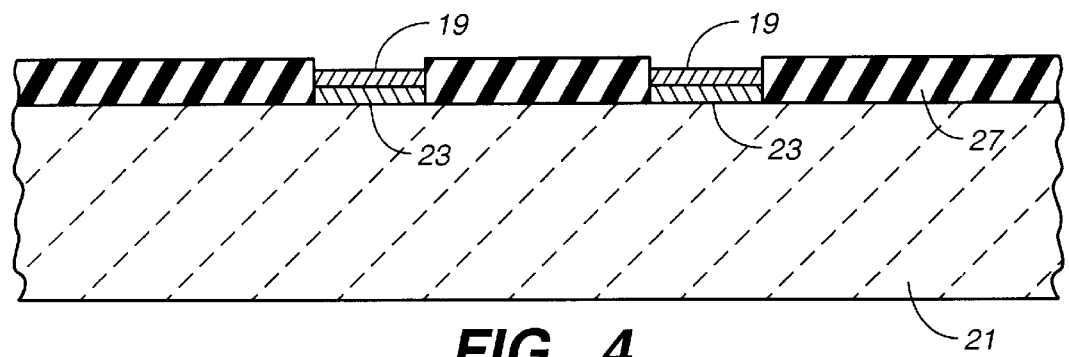
FIG._4

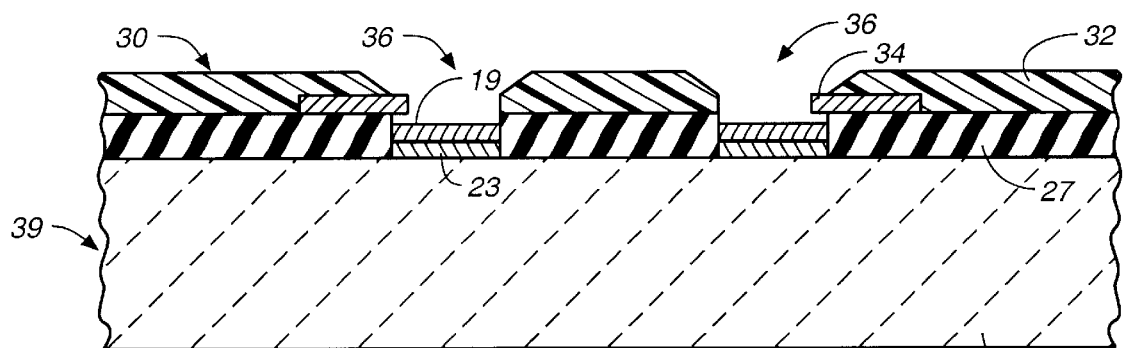
FIG._5
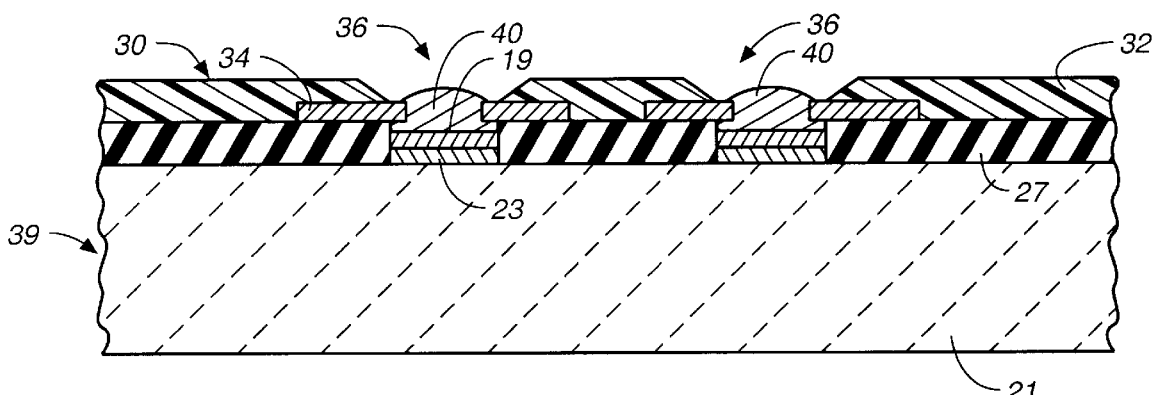
FIG._6
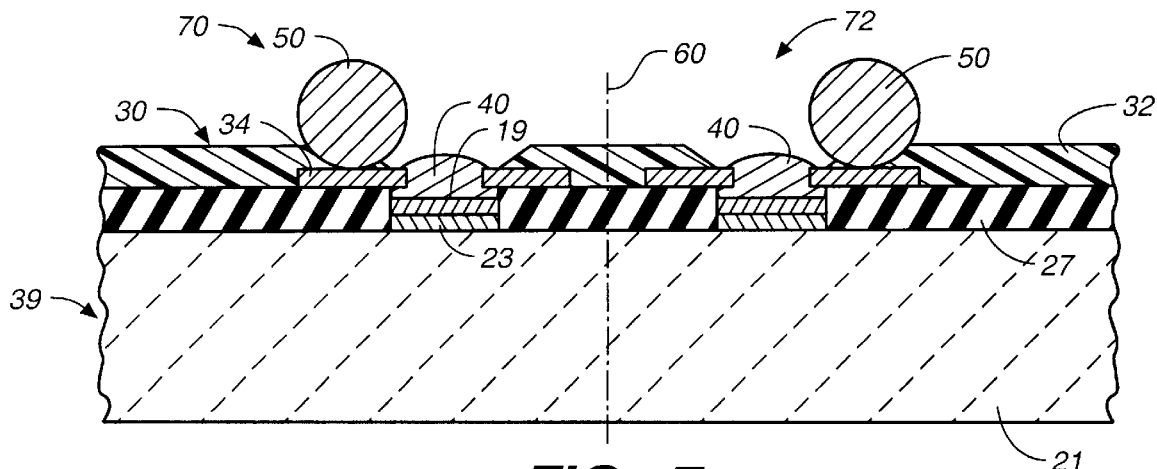
FIG._7

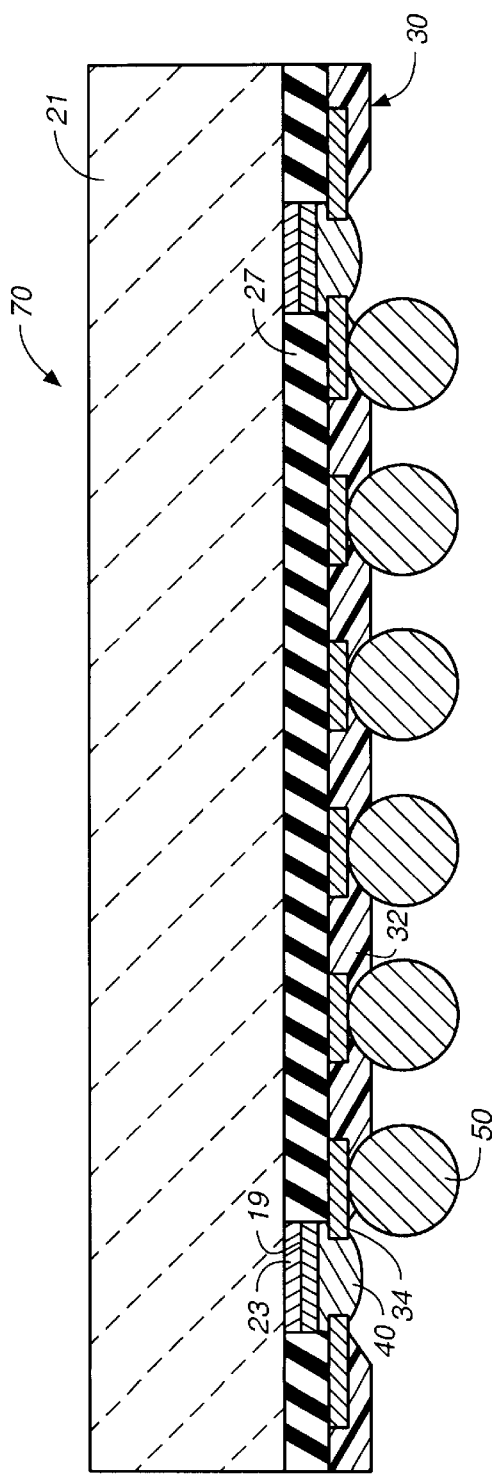
FIG._8
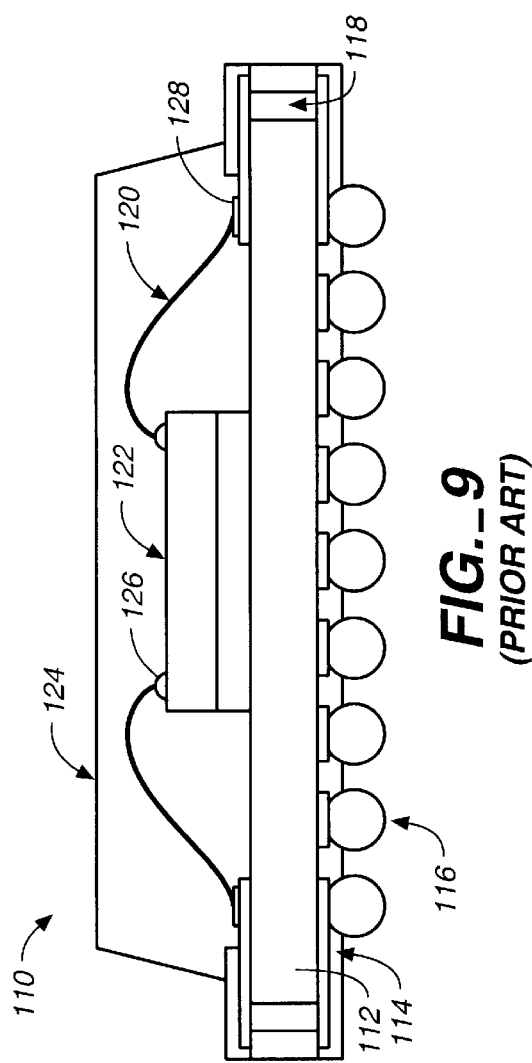
FIG._9
(PRIOR ART)

INTEGRATED CIRCUIT PACKAGE FORMED AT A WAFER LEVEL

TECHNICAL FIELD

The invention relates generally to integrated circuit packages, and more specifically to a ball-grid array integrated package formed at a wafer level.

BACKGROUND ART

The footprint of an integrated circuit package on a circuit board is the area of the board occupied by the package. It is generally desired to minimize the footprint and to place packages close together. In recent years, the ball-grid array (BGA) package has emerged as one of the more popular package types because it provides high density, minimum footprint, and shorter electrical paths, which means that it has better performance than previous types of semiconductor packages.

A typical BGA package is shown in FIG. 9. In the BGA package 110, an integrated circuit chip 122 is mounted by means of an adhesive on an upper surface of a base 112 made of a substrate material. Metal bonding wires or wirebond leads 120 electrically connect a plurality of metal chip pads 126 formed on the upper surface of the chip 122 with wire bonding pads 128 formed on the upper surface of the base 112. The base 112 includes plated through-hole vias 118 and metal traces 114 to connect the circuitry from the upper surface to the lower surface of the base 112. A plurality of solder balls 116 are placed on the bottom surface of the base 112 and are electrically connected to the metal traces 114 of the base. The solder balls 116 can be arranged in a uniform full matrix array over the entire bottom surface, in a staggered full array, or around the perimeter of the bottom surface in multiple rows. The solder balls are then used to secure the chip package onto a printed circuit board in the end-use product.

While the BGA packages of the prior art provide a great improvement over earlier types of packages in terms of high density and high I/O capability, it is always desired to make the IC package even smaller to further decrease the amount of space needed on a printed circuit board to accommodate the package. Because the wirebond leads are of a predetermined length and require a minimum spacing between adjacent bonding sites to provide sufficient room for the bonding tool, the substrate base must be larger than the chip and it is not possible to fabricate a more compact package. Ideally, it is desired to make a package in which the substrate base does not have to be any larger than the size of the chip.

In the prior art, as described above, it is common to fabricate a package for each individual die. Others have realized that it would be advantageous to be able to form the IC package at the wafer level, that is, after the individual chips have been formed on the wafer but before the wafer has been diced into individual chips. This allows for easier mass production of chip packages and for several chip packages, arranged in a matrix format on the wafer, to be manufactured and tested all at one time. This can reduce time and cost in the process of packaging and testing IC chips.

Some examples of packaging methods in the prior art that are conducted at the wafer level include: U.S. Pat. No. 5,604,160 to Warfield, which discloses using a cap wafer to package semiconductor devices on a device wafer; U.S. Pat. No. 5,798,557 to Salatino et al., which describes a wafer level hermetically packaged integrated circuit having a protective cover wafer bonded to a semiconductor device substrate wafer; and U.S. Pat. No. 5,851,845 to Wood et al., which discloses a method of forming a semiconductor package by providing a wafer containing a plurality of dice, thinning a backside of the wafer by polishing or etching, attaching the thinned wafer to a substrate, and then dicing the wafer.

It is the object of the present invention to provide a ball-grid array IC package that has a minimum size such that the IC package takes up no more space than the area of the IC chip.

It is a further object of the invention to provide an IC package at the wafer level in order to take advantage of the greater efficiency in mass production and the ability to conduct parallel testing of the IC packages.

SUMMARY OF THE INVENTION

The above objects have been achieved in an integrated circuit package that is formed on the wafer level using a flip chip design with a single wafer. The integrated circuit package is formed by first providing a product silicon wafer having a plurality of microelectric circuits fabricated thereon and having a plurality of standard aluminum bonding pads exposed. The aluminum bonding pads are re-metallized to be solderable. Then, a layer of adhesive is deposited onto the wafer surface, the bonding pads remaining exposed. A pre-fabricated interposer substrate, having metallized openings, is aligned to the wafer and then the assembly is cured. Solder, or conductive adhesive, is then deposited through the openings in the substrate and the assembly is reflowed, or cured, to form the electrical connection between the circuitry on the substrate and the bonding pads on the silicon wafer. Solder balls are then placed on the metal pads on the substrate and are then reflowed forming a BGA structure. The wafer is then diced and the individual BGA packages are formed. The BGA package is flipped for mounting on a circuit board.

The integrated circuit package of the present invention is smaller than BGA packages of the prior art in that the additional space usually required because of the use of wirebonding leads is not necessary. The whole wafer can be packaged all at one time which is more efficient than packaging each die individually and allows for parallel testing of the packaged dice while still in wafer form.

BRIEF DESCRIPTION OF THE DRAWINGS

FIG. 1 is a perspective view of a silicon wafer having a plurality of chips formed on a top surface.

FIG. 2 is a cross-sectional view of a section 2—2 of the silicon wafer shown in FIG. 1.

FIGS. 3–6 are cross-sectional views of the silicon wafer of FIG. 1 showing the various process steps used in forming the IC package of the present invention.

FIG. 7 is a cross-sectional view of the silicon wafer of FIG. 1, showing the finalized wafer assembly for the IC package of the present invention.

FIG. 8 is a cross-sectional view of the finalized IC package of the present invention.

FIG. 9 is a cross-sectional view of a ball-grid array package as known in the prior art.

BEST MODE FOR CARRYING OUT THE INVENTION

With reference to FIG. 1, a silicon wafer 21 has a plurality of microcircuits fabricated thereon. The microcircuits are arranged into a matrix of individual chips or dice 24, 25. A plurality of aluminum bonding pads 23 are arranged around the perimeter of each of the chips. In prior art packaging operations, the wafer 21 is usually diced at this point into individual chips, and each of the individual chip is then packaged. In the present invention, the chips are formed on the wafer but are not diced until the packaging operation on the wafer has been completed, thus the packaging of the chip is conducted at the wafer level.

With reference to FIG. 2, a section 2—2 of the wafer 21 is shown, with the aluminum bonding pads 23 being disposed on a top surface of the wafer 21. The first step in the packaging process, is to re-metallize the aluminum bonding pads 23 in order to make the bonding pads solderable. Aluminum, which is commonly used for the wirebond pads of IC's, is a less than ideal metal for use in solder connections due to the fact that the aluminum tends to oxidize which creates bonding problems. In the forming of the IC package of the present invention, the aluminum bonding pads need to be wetable by solder or have a low ohmic contact resistance for application of a conductive adhesive. Therefore, the bonding pads need to be re-metallized. One process for re-metallizing the bonding pads, that is inexpensive and convenient to implement, is to use electroless nickel-gold plating. With reference to FIG. 3, first, a layer of zinc is deposited on the aluminum bonding pads 23, then a layer of electroless nickel plating is deposited on the layer of zinc and, then, a layer of electroless gold plating is deposited on top of the electroless nickel plating to form a nickel-gold plating 19 in order to make the bonding pads 23 conducive to soldering. Alternatively, a thin film metallization process can be carried out to re-metallize the bonding pads.

Next, referring to FIG. 4, a layer of adhesive 27 is deposited on the top surface of the wafer 21 such that the bonding pads 23 are left uncovered. The adhesive can be made of a silicone elastomer. The adhesive layer 27 can be applied through a screen printing process in which the silicone elastomer material is pushed through the openings of a stencil or a mesh screen. The screen is mounted onto a screen printer and is precisely positioned with respect to the wafer. A certain amount of the silicone elastomer material is dispensed along one edge of the screen and an air-operated squeegee presses down on the screen as it sweeps across it, sheering the material at a constant pressure. The material acquires higher flowability above certain shear pressures, which allows it to go through the screen and fill the gaps left by the wire mesh of the screen. The area above the bonding pads 23 is blocked so that no material is laid on top of the bonding pads. The screen is removed and a uniform layer of the material is formed on top of the wafer. Alternatively, an adhesive layer preform can be used to adhere the adhesive layer 27 to the top surface of the wafer 21 or to the backside of an interposer substrate layer. The silicone elastomer acts as an encapsulant, providing environmental protection for the wafer. The silicone elastomer also acts as a buffer for the wafer 21 from external stresses, such as a thermal coefficient of expansion mismatch between the wafer and the package solder balls used for mounting the IC package, or a mismatch between the wafer and an end-use printed circuit board on which the IC package would be mounted.

With reference to FIG. 5, an interposer substrate layer 30 is then secured on top of the elastomer layer 27 to form a wafer assembly 39. The interposer substrate 30 is a preformed substrate consisting of metal circuitry 34 and a dielectric base 32. The metal circuitry 34 typically consists of copper traces formed throughout the substrate. The interposer substrate 30 can also include solder resist coatings to help define solder wetable areas on the copper metal circuitry. The metal circuitry 34 can be formed on a single layer or on multiple layers of the interposer substrate 30. The copper metal circuitry can be nickel-gold plated or coated by an organic material. The dielectric base material 32 is typically made of a polyamide base substrate. Alternatively, BT resin and other epoxy-glass substrates can also be used as the dielectric base material 32. The metal circuitry 34 generally serves as interconnect circuitry, as the traces can be routed throughout the substrate to interconnect the circuits from the various bonding pads 23 to the Input/Output (I/O) interconnects which will be added to the wafer assembly 39, as described later with reference to FIG. 7.

A key feature of the interposer substrate 30 is a plurality of openings 36 on the copper circuitry. The interposer substrate 30 can be approximately the same size as the wafer 21 and is aligned to the wafer 21 such that the openings 36 line up with the bonding pads 23. A sufficient amount of copper must be present in the openings 36 to provide adequate connection for solder or for a conductive adhesive. A circular copper ring around the openings 36 or a copper strip across the openings 36 can be used to facilitate this requirement. The interposer substrate 30 is then adhered by a bonding adhesive to the elastomer layer 27 and the wafer assembly 39 is then cured. Thus, the interposer is aligned and bonded to the wafer.

With reference to FIG. 6, a layer of solder paste 40 is deposited through the openings 36 of the interposer substrate 30. This can be carried out by a screen or stencil printing process in the same manner as described above with reference to the depositing of the elastomer layer 27. The interposer substrate base 32 layer is screened off and the solder paste 40 is deposited into the openings 36 by an air-operated squeegee so that the solder paste 40 is deposited on the wafer all at one time. The wafer 21 is then solder reflowed to form a plurality of electrical connections between the bonding pads 23 on the wafer 21 and the copper metal circuitry 34 in the interposer substrate layer 30. The solder paste can also be deposited through the openings of the interposer substrate by the use of automatic dispensing equipment or by solder preform placement. Alternatively, a conductive adhesive may be used, in lieu of the solder paste, to electrically connect the bonding pads 23 and the metal circuitry 34. The adhesive is deposited in the openings 36 and then is cured to form the electrical connections. Optionally, an epoxy material can be used to protect the solder connections. Application of the epoxy material would also be by the screen or stencil printing process described above and the protective coating would then be cured.

The next step is to place package solder balls on the wafer. The package solder balls serve as the I/O interconnects for the package and will be used to secure the completed IC package to an end-use printed circuit board. With reference to FIG. 7, the solder balls 50 are placed on the metallized openings 36 through a mechanical transfer of pre-formed solder balls. Alternatively, the solder balls 50 can be formed by screen or stencil printing solder paste. The solder is then reflowed to form the package solder balls. The solder balls 50 are applied in whatever type of pattern is desired, such as in a uniform full matrix over the entire surface.

At this point, electrical testing may be conducted on the wafer assembly 39 since the wafer assembly 39 contains finished dice arranged in a matrix format. This allows for parallel testing, which can be conducted at the wafer level and can provide savings in testing time and cost. Then the wafer assembly 39 is diced, or singulated, to form individual chip-size BGA packages 70, 72. A common technique for the singulation is to use a wafer saw with diamond or resinoid saw blades. With reference to FIG. 8, the finished BGA package 70 can then be mounted on the end-use printed circuit board in the same manner as prior art BGA packages. The BGA package 70 of the present invention has the same footprint as the individual silicon die, as no extra space is needed to accommodate wirebond leads or larger substrate bases. In this way, the integrated circuit package of the present invention provides the advantages of a smaller package size and the convenience of packaging at the wafer level.

What is claimed is:

1. An integrated circuit package formed at a wafer level, comprising:

a silicon die having an area and having a plurality of bonding pads arranged on a first surface, an adhesive layer covering a substantial portion of the first surface of the die, the plurality of bonding pads remaining exposed, an interposer substrate disposed on the adhesive layer and including a plurality of metallized openings, said metallized openings forming a plurality of metallized vias, the vias being aligned with the plurality of bonding pads of the die, said interposer substrate further including a plurality of metal circuit traces for interconnecting the plurality of metallized vias, said circuit trace being recessed within the substrate, means for electrically connecting the plurality of metallized vias of the interposer substrate and the plurality of bonding pads on the die, and a plurality of I/O interconnects formed on the plurality of metallized openings of the interposer substrate to form a connection to the recessed metal traces.

2. The integrated circuit package of claim 1 wherein the plurality of I/O interconnects are solder balls formed on the interposer substrate.

3. The integrated circuit package of claim 1 wherein the means for electrically connecting the plurality of metallized openings and the plurality of bonding pads is solder.

4. The integrated circuit package of claim 1 wherein the means for electrically connecting the plurality of metallized openings and the plurality of bonding pads is a conductive adhesive.

5. The integrated circuit of claim 1 wherein the interposer substrate has an area of a same size as the area of the die.

6. An integrated circuit package formed at a wafer level, comprising:

a silicon die having an area and having a plurality of bonding pads arranged on a first surface, an adhesive layer covering a substantial portion of the first surface of the die, the plurality of bonding pads remaining exposed, an interposer substrate composed of a dielectric material having a plurality of recessed metal circuit traces disposed throughout, the interposer substrate being disposed on the adhesive layer and including a plurality of metallized openings forming a plurality of metallized vias which are aligned with the plurality of bonding pads of the die, said openings having a strip of copper across the opening, said vias being interconnected by said metal circuit traces, the interposer substrate having an area of a same size as the area of the die, a plurality of metallurgical electrical connections formed between the plurality of solder-filled vias of the interposer substrate and the plurality of bonding pads on the die, and a plurality of solder balls formed on the plurality of metallized openings of the interposer substrate to form a connection to the recessed metal traces.

7. The integrated circuit package of claim 6 wherein the plurality of electrical connections are formed by solder.

8. An integrated circuit package formed at a wafer level, comprising:

a silicon die having an area and having a plurality of bonding pads arranged on a first surface, an adhesive layer covering a substantial portion of the first surface of the die, the plurality of bonding pads remaining exposed, an interposer substrate disposed on the adhesive layer and including a plurality of metal circuit traces and a plurality of metallized openings forming a plurality of metallized vias, the vias being aligned with the plurality of bonding pads of the die, and being filled with a conductive adhesive to form a plurality of electrical connections between the plurality of metallized openings of the interposer substrate and the plurality of bonding pads on the die, and a plurality of I/O interconnects formed on the plurality of metallized openings of the interposer substrate.

* * * * *